US012748909B2

(12) United States Patent
Tripathi et al.

(10) Patent No.: US 12,748,909 B2
(45) Date of Patent: Sep. 29, 2026

(54) SYSTEMS AND METHODS FOR MACHINE LEARNING BASED VOLTAGE DROP PREDICTION FOR A 3D STACKED DEVICE

(71) Applicant: XILINX, INC., San Jose, CA (US)

(72) Inventors: Aashish Tripathi, Hyderabad (IN); Sundeep Ram Gopal Agarwal, Hyderabad (IN); Ashit Debnath, Hyderabad (IN); Atreyee Saha, Hyberdad (IN); Praful Jain, San Jose, CA (US)

(73) Assignee: XILINX, INC., San Jose, CA (US)

( * ) Notice: Subject to any disclaimer, the term of this patent is extended or adjusted under 35 U.S.C. 154(b) by 599 days.

(21) Appl. No.: 18/227,225

(22) Filed: Jul. 27, 2023

(65) Prior Publication Data

US 2025/0036848 A1 Jan. 30, 2025

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC ........ G06F 30/30; G06F 30/39; G06F 30/398; G06F 30/392; G06F 2119/06; H10D 89/10; G06N 3/08; G06N 3/088; G06N 3/09; G06N 3/091; G06N 3/092
USPC .......................................................... 716/111
See application file for complete search history.

(56) References Cited

U.S. PATENT DOCUMENTS

2015/0370944 A1* 12/2015 Wang .................... G06F 30/398 716/132

OTHER PUBLICATIONS

G. Venezian, "On the resistance between Two Points on a Grid" American journal of Physics, vol. 62, No. 11, pp. 1000-1004, Nov. 1994.
Wang, S., et al. "P/G Tsv Planning for IR-drop Reduction in 3D-ICs," 2014 Design, Automation & Test in Europe Conference & Exhibition (DATE), Dresden, Germany, 2014, pp. 1-6.
Wang, Z., et al. "Image quality assessment: from error visibility to structural similarity," in IEEE Transactions on Image Processing, vol. 13, No. 4, pp. 600-612, Apr. 2004.
Kanopoulos, N., et al., "Design of an image edge detection filter using the Sobel operator," in IEEE Journal of Solid-State Circuits, vol. 23, No. 2, pp. 358-367, Apr. 1988.

* cited by examiner

*Primary Examiner* — Paul Dinh
(74) *Attorney, Agent, or Firm* — Patterson + Sheridan, LLP

(57) ABSTRACT

A method for predicting voltage drop on a power delivery network of a 3D stacked device includes receiving a spatial power distribution map of a plurality of semiconductor dies of the 3D stacked device, receiving a spatial power source node location map for a plurality of power source nodes coupled to the 3D stacked device, dividing vertically the spatial power distribution map and the spatial power source node location map into overlapping windows, determining a voltage drop map in each of the windows based on the divided spatial power distribution map and the divided spatial power source node location map, and combining the voltage drop map in each of the windows to form a composite voltage drop map.

20 Claims, 10 Drawing Sheets

SYSTEMS AND METHODS FOR MACHINE LEARNING BASED VOLTAGE DROP PREDICTION FOR A 3D STACKED DEVICE

TECHNICAL FIELD

Examples of the present disclosure generally relate to integrated circuit (IC) design, and in particular to systems and methods for machine learning (ML) based voltage (IR) drop prediction on a power distribution network (PDN) of a three-dimensional (3D) stacked device containing a plurality of semiconductor dies.

BACKGROUND

In a semiconductor device, a PDN can be modeled as a network of voltage sources (e.g., power pads), current sinks (e.g., cells or instances), and resistances (e.g., wires and vias). As a part of a PDN analysis, voltage at the gates of the programmable logic circuits should be ensured to remain above a certain threshold voltage in order to prevent functional failures. Voltage (IR) drop causes a lower voltage to be available at a logic circuit from a higher voltage supplied by a power source (power pads). Traditionally, a PDN analysis of finding the voltage at every node in a two-dimensional (2D) network amounts to solving a system of linear equations of the form GV=J, where G is a conductance matrix, V is an unknown vector of voltages, and j is a vector of currents. However, solving this system of equations is computationally expensive as there can be millions of nodes in a 2D PDN.

A PDN implemented on a 3D stacked device allows for vertical connectivity among ICs on different semiconductor dies (or dice) stacked in the z-dimension. While this topology provides increased bandwidth between the semiconductor dies, a PDN analysis of finding the voltage at every node in a 3D network is more challenging than in a 2D network. For example, the increased logic density of a 3D PDN leads to more current being drawn within a unit area as compared to that of a 2D PDN. Having to support multiple power supplies and non-uniform (e.g., variable) current loads further adds to the complexity. As circuit elements across different die layers are connected through electrical connections such as bumps, traces, and through silicon vias (TSVs), misalignment among these circuit elements and electrical connections on different semiconductor dies can create critical voltage (IR) bottlenecks that adversely impact the device's performance. In addition, voltage drops on the 3D PDN can affect the clock rates at which various circuits on the semiconductor dies are intended to operate. Using the general pessimism for planar chip design in timing calculation to avoid functional failures in a 3D IC design may be overly pessimistic and further lower the performance of the 3D device. Hence, the ability to accurately and efficiently predict voltage drops on a 3D PDN is crucial to the success of a 3D circuit design, as failure to do so can lead to functional failures of a design implementation.

SUMMARY

Systems and methods for ML based voltage (IR) drop prediction on a PDN of a 3D stacked device are described.

According to one aspect, there is a method for predicting voltage drop on a power delivery network (PDN) of a 3D stacked device comprising a plurality of semiconductor dies stacked vertically on each other. The method includes receiving a spatial power distribution map of the plurality of semiconductor dies; receiving a spatial power source node location map for a plurality of power source nodes coupled to the 3D stacked device; dividing, vertically, the spatial power distribution map and the spatial power source node location map into overlapping windows; determining a voltage drop map in each of the windows for at least one of the plurality of semiconductor dies based on the divided spatial power distribution map and the divided spatial power source node location map; and combining the voltage drop map in each of the windows to form a composite voltage drop map for the at least one of the plurality of semiconductor dies.

According to another aspect, there is a computer system comprising a processor and a non-transitory machine readable medium storing executable instructions thereon. The instructions when executed by the processor cause the processor to perform operations, including receiving a spatial power distribution map of the 3D stacked device comprising a plurality of semiconductor dies stacked vertically on each other; receiving a spatial power source node location map for a plurality of power source nodes coupled to the 3D stacked device; dividing, vertically, the spatial power distribution map and the spatial power source node location map into overlapping windows; determining a voltage drop map in each of the windows for at least one of the plurality of semiconductor dies based on the divided spatial power distribution map and the divided spatial power source node location map; and combining the voltage drop map in each of the windows to form a composite voltage drop map for the at least one of the plurality of semiconductor dies.

According to another aspect, there is a non-transitory computer-readable storage medium storing instructions, which when executed on one or more processing devices, perform an operation for predicting voltage drop on a power delivery network (PDN) of a 3D stacked device comprising a plurality of semiconductor dies stacked vertically on each other, the operation comprising receiving a spatial power distribution map of the 3D stacked device comprising a plurality of semiconductor dies stacked vertically on each other; receiving a spatial power source node location map for a plurality of power source nodes coupled to the 3D stacked device; dividing, vertically, the spatial power distribution map and the spatial power source node location map into overlapping windows; determining a voltage drop map in each of the windows for at least one of the plurality of semiconductor dies based on the divided spatial power distribution map and the divided spatial power source node location map; and combining the voltage drop map in each of the windows to form a composite voltage drop map for the at least one of the plurality of semiconductor dies.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
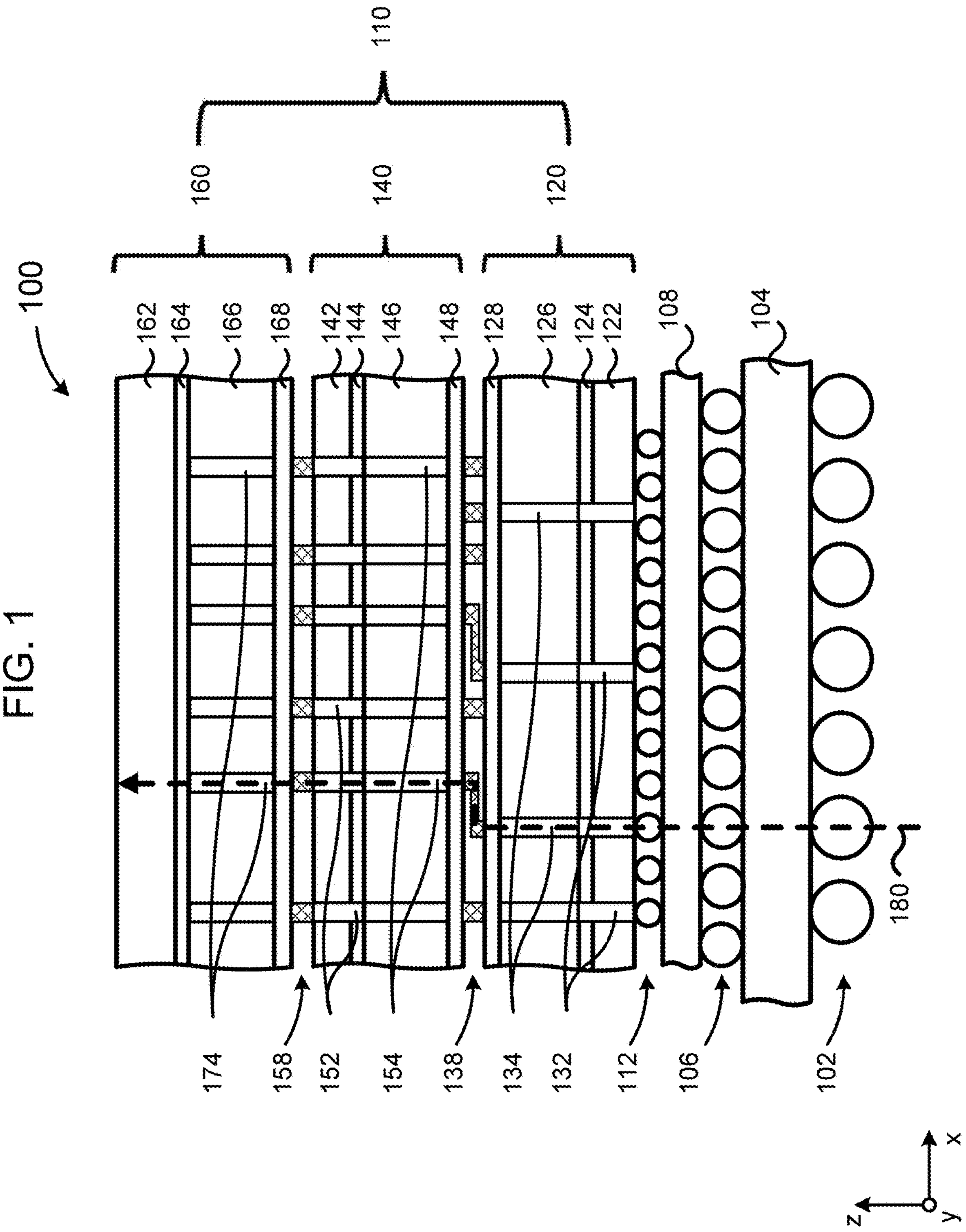
FIG. 1 illustrates a cross-sectional view of a portion of a 3D stacked semiconductor package, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive explanation of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe systems and methods for ML based voltage drop prediction on a PDN of a 3D stacked device. The 3D stacked devices include a plurality of semiconductor dies (or chips) stacked in a vertical direction such that each die is bonded to a die above, below, or both in the stack. In one embodiment, each of the semiconductor dies may include, but are not limited to, field programmable gate arrays (FPGAs), memory devices (e.g., DRAM or SRAM chips), processors, accelerators, systems on a chip (SoC), application specific integrated circuits (ASICs), and the like.

Embodiments of the present disclosure focus on reducing computation overheads (e.g., runtimes and resources) of predicting voltage drops on the 3D PDN, and improving performance of 3D stacked devices. According to an exemplary method, a computer system receives a spatial power distribution map of a placed and/or routed 3D IC design and a spatial power source node map. The computer system divides, vertically (e.g., in the z-dimension), the spatial power distribution map and the spatial power source node map into overlapping windows (e.g., in the x-y plane), predicts voltage drop in each window using an ML based voltage drop prediction network, and stitches the voltage drop maps together to create a composite voltage drop distribution map for at least one of the semiconductor die layers. Put differently, the method breaks a large device into overlapping windows, determines a voltage drop map in each window for one of the semiconductor die layers, and then stitches the predicted voltage drop maps together to create a composite voltage drop distribution map for the entire semiconductor die layer. The voltage drop prediction map of one or more windows can be done in parallel. The ML based voltage drop prediction network is trained, by using one or more of spatial power distribution from artificially placed designs, different power source node patterns, and real implemented IC designs optimized with respect to one or more loss functions, to enable fast and accurate voltage drop predictions.

FIG. 1 illustrates a cross-sectional view of a portion of a 3D stacked semiconductor package 100, according to an example. As illustrated in FIG. 1, ball grid array (BGA) balls 102 are used to mount the 3D stacked semiconductor package 100 onto a board or other base connection (not explicitly shown in FIG. 1). A package substrate 104 is provided above and connected to the BGA balls 102. Power source node bumps (e.g., Controlled Collapse Chip Connection (C4) bumps) 106 are used to connect the package substrate 104 with an interposer 108, on which a 3D stacked device 110 is disposed. The power source node bumps 106 may electrically connect the 3D stacked device 110 to external circuitry and/or power sources.

In the illustrated example, the 3D stacked device 110 includes a bottom semiconductor die 120, an intermediate semiconductor die 140, and a top semiconductor die 160 stacked in the z-dimension. Each of the semiconductor dies 120, 140, and 160 may include a substrate, one or more intermediate metal layers, interconnections, and a top metal layer. Depending upon how a die is stacked relative to the dies underneath it, the substrate may be on top, as is the case with substrates 142 and 162, or at the bottom, as is the case with substrate 122.

As illustrated in FIG. 1, the bottom semiconductor die 120 includes a substrate (e.g., a silicon substrate) 122, a device layer (or an active layer) 124, a dielectric layer 126, and a top metal layer 128. The substrate 122 includes TSVs 132 for connecting microbumps 112 to circuit elements on the device layer 124. The bottom semiconductor die 120 also includes dedicated via stacks 134 (e.g., chimney stack vias (CSVs)) for connecting various circuit elements on the device layer 124 to the top metal layer 128.

As illustrated in FIG. 1, the intermediate semiconductor die 140 includes a substrate (e.g., a silicon substrate) 142, a device layer (or an active layer) 144, a dielectric layer 146, and a top metal layer 148. The intermediate semiconductor die 140 is stacked face to face with the bottom semiconductor die 120. Thus, the top metal layer 148 of the intermediate semiconductor die 140 faces the top metal layer 128 of the bottom semiconductor die 120. The semiconductor dies 120 and 140 are die-to-die bonded by, for example, inter-die bonds 138. The intermediate semiconductor die 140 includes dedicated via stacks 154 (e.g., CSVs) for connecting the top metal layer 148 to the circuit elements on the device layer 144. The substrate 142 includes TSVs 152 for connecting the circuit elements on the device layer 144 to the top surface of the substrate 142 for connection to the top semiconductor die 160.

As illustrated in FIG. 1, the top semiconductor die 160 includes a substrate (e.g., a silicon substrate) 162, a device layer (or an active layer) 164, a dielectric layer 166, and a top metal layer 168. The top semiconductor die 160 is stacked on the intermediate semiconductor die 140. The top metal layer 168 of the top semiconductor die 160 faces the substrate 142 of the intermediate semiconductor die 140. The semiconductor dies 140 and 160 are die-to-die bonded by, for example, inter-die bonds 158. The top semiconductor die 160 includes dedicated via stacks 174 (e.g., CSVs) for connecting the top metal layer 168 to circuit elements on the device layer 164.

Although three semiconductor dies are shown in FIG. 1, the 3D stacked device 110 may include more or less than three semiconductor dies (e.g., two, four, five, or six dies). For example, there may be one or more additional intermediate semiconductor dies 140 stacked on top of each other in the same way (e.g., "upside down", with substrate on top, metal face on the bottom). Further, the semiconductor dies 120, 140, and 160 may be encased in a protective material (e.g., an epoxy) to provide further structural support and protection when being packaged.

In some embodiments, each of the device layers 124, 144, and 164 may include one or more ICs. An example of an IC is a field programmable gate array (FPGA) having programmable circuit blocks. Examples of programmable circuit blocks may include, but are not limited to, input/output blocks (IOBs), configurable logic blocks (CLBs), dedicated random access memory blocks (BRAM), digital signal processing blocks (DSPs), processors, clock managers, and delay lock loops (DLLs). Other examples of programmable ICs may include programmable logic in combination with one or more other subsystems. For example, some programmable ICs may include System-on-Chips (SOCs) or SOCs that include both programmable logic and a hardwired processor. Other varieties of programmable ICs may include additional and/or different subsystems. In some embodiments, each of the device layers 124, 144, and 164 may include one or more fixed instantiations (e.g., ASIC), or combined in a single integrated circuit (e.g., SOC) with programmable logic. The circuits in the device layers 124, 144, and 164 together form a 3D IC, and are powered by a 3D PDN. In some embodiments, the 3D stacked device may include a heterogeneous 3D IC with non-uniform current loads.

As illustrated in FIG. 1, there are misalignments between the dedicated via stacks 134 in the bottom semiconductor die 120 and the dedicated via stacks 154 in the intermediate semiconductor die 140. These misalignments lead to current pathways (e.g., current path 180) that change in x- and/or y-coordinates as the current moves upward through the die stack, and contribute to voltage drops on the 3D PDN. Voltage drops on a 3D PDN present a greater concern than those in 2D contexts. This is because, on a 3D PDN, it is necessary to consider both additional resistance along power rails due to the TSVs and dedicated via stacks as well as higher current densities resulting from a greater number of circuit elements (e.g., transistors) per unit area. Also, the upper semiconductor die layers on a 3D PDN tend to experience higher voltage drops due to longer current paths through the 3D PDN. Voltage drops on the 3D PDN can also affect the clock rates at which various circuits on the semiconductor dies are intended to operate. Using the general pessimism for planar chip design in timing calculation to avoid functional failures in a 3D IC design may be overly pessimistic and further lower the performance of the 3D device. Systems and methods described in the present disclosure accurately and efficiently predict voltage drops on a 3D PDN to prevent functional failure and improve device performance.

Figure 2:
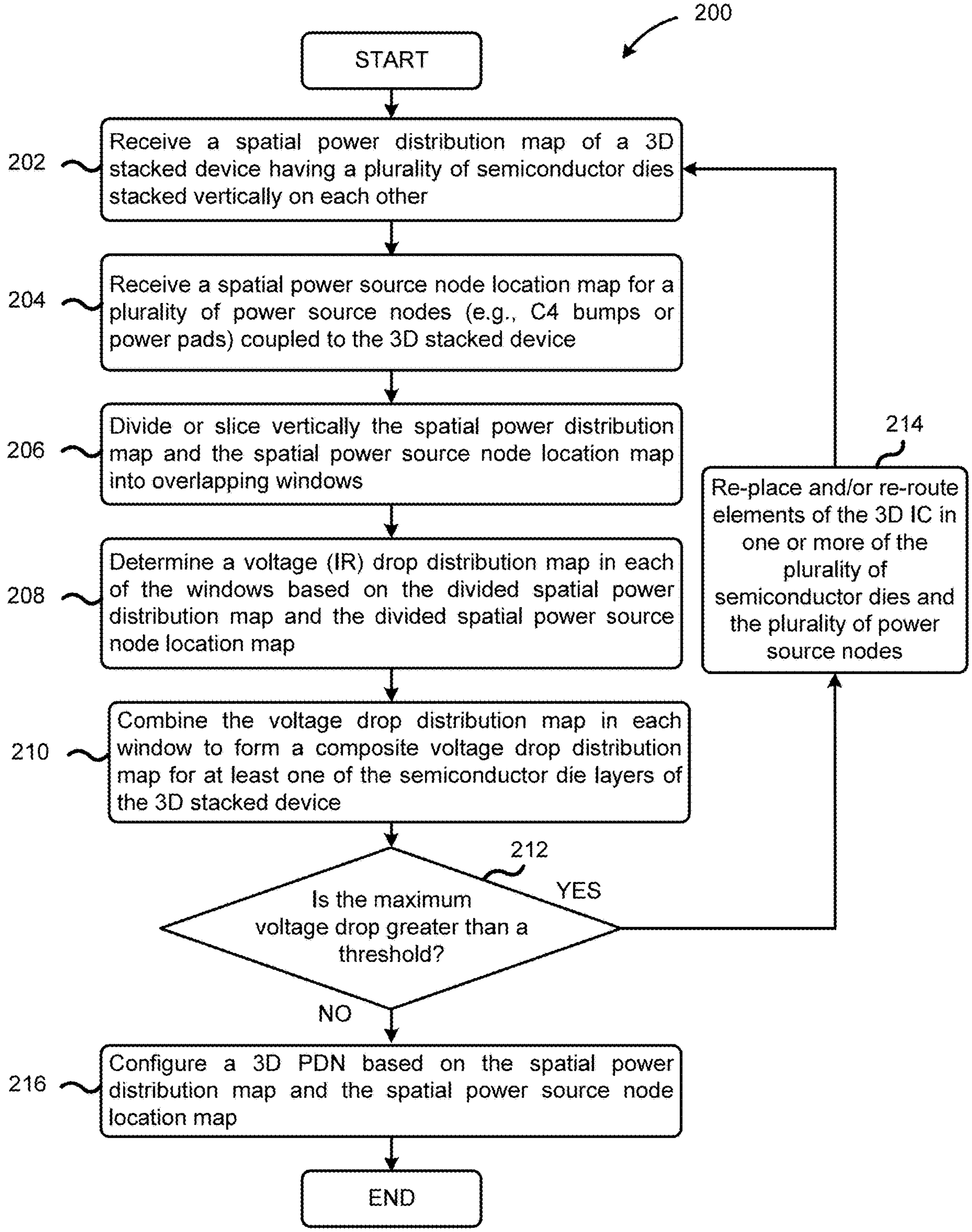
FIG. 2 illustrates a flowchart of a method performed by a computer system for ML based voltage drop prediction on a PDN of a 3D stacked device, according to an example.

FIG. 2 illustrates a flowchart 200 of a method for ML based voltage drop prediction on a PDN of a 3D stacked device, according to an example. The flowchart 200 can be implemented by a computer system to mitigate IR drop related function failures in the placement stage of implementation flow. It should be understood that the ML based IR drop prediction according to the flowchart 200 can be performed in other usage scenarios. For example, a similar flow can exist after the routing stage of implementation, where an IR drop map is rendered as an interactive visual heatmap for users to view and analyze. The number of layers indicated and described with reference to the flowchart 200 (and any other figures) is for illustration purposes only, and not intended to limit the scope of the present disclosure.

The 3D stacked device includes a plurality of semiconductor dies stacked vertically on each other (e.g., in the z-dimension). In some embodiments, the PDN of the 3D stacked device may include a heterogeneous 3D IC with non-uniform current loads. The heterogeneous 3D IC may include a large number of different programmable tiles including multi-gigabit transceivers (MGTs), configurable logic blocks (CLBs), random access memory blocks (BRAMs), input/output blocks (IOBs), configuration and clocking logic (CONFIG/CLOCKS), digital signal processing blocks (DSPs), specialized input/output blocks (I/O), for example, clock ports, and other programmable logic such as digital clock managers, analog-to-digital converters, system monitoring logic, and so forth. Some programmable ICs having FPGA logic may also include dedicated processor blocks and internal and external reconfiguration ports. In some embodiments, the method described in flowchart 200 is for predicting static voltage drop on a PDN of a 3D stacked device.

In some embodiments, an electronic design automation (EDA) tool executing on a computer system may be used for the ML based voltage drop prediction according to the method shown in FIG. 2. In some embodiments, an ML based voltage drop prediction tool executing on the computer system is used for the ML based voltage drop prediction. In some embodiments, a circuit design tool (e.g., Simulation Program with Integrated Circuit Emphasis (SPICE) software) executing on the computer system may be used to simulate the circuit designs.

At block 202, the computer system obtains or receives a spatial power distribution map of the 3D stacked device. The spatial power distribution map may include a power distribution map of current loads on each semiconductor die of the 3D stacked device. In one example, a netlist of a 3D IC design is input to the computer system. The 3D IC design may be partially placed, fully placed, or placed-and-routed using the EDA tool. Based on the 3D IC design, the computer system may provide a spatial rendering of power being consumed by the circuit elements of the 3D IC on the PDN based on the at least partially placed design.

In the present embodiment, the spatial power distribution map may include a current load distribution (or current density) map of each of the semiconductor dies of the 3D stacked device. For example, the spatial power distribution map may include a series of 2D current density maps, represented as images, of the circuitry on each of the semiconductor dies.

At block 204, the computer system obtains or receives a spatial power source node location map for a plurality of power source nodes coupled to the 3D stacked device. The spatial power source node location map may include the locations of the power source nodes. The power source nodes are coupled to power sources that supply power (e.g., current) to the PDN of the 3D stacked device. In one example, the spatial power source node location map may include a 2D image showing locations of the C4 bumps coupled to the 3D stacked device.

At block 206, the computer system divides or slices vertically (e.g., in the z-dimension) the spatial power distribution map and the spatial power source node location map into overlapping windows.

Figure 3:
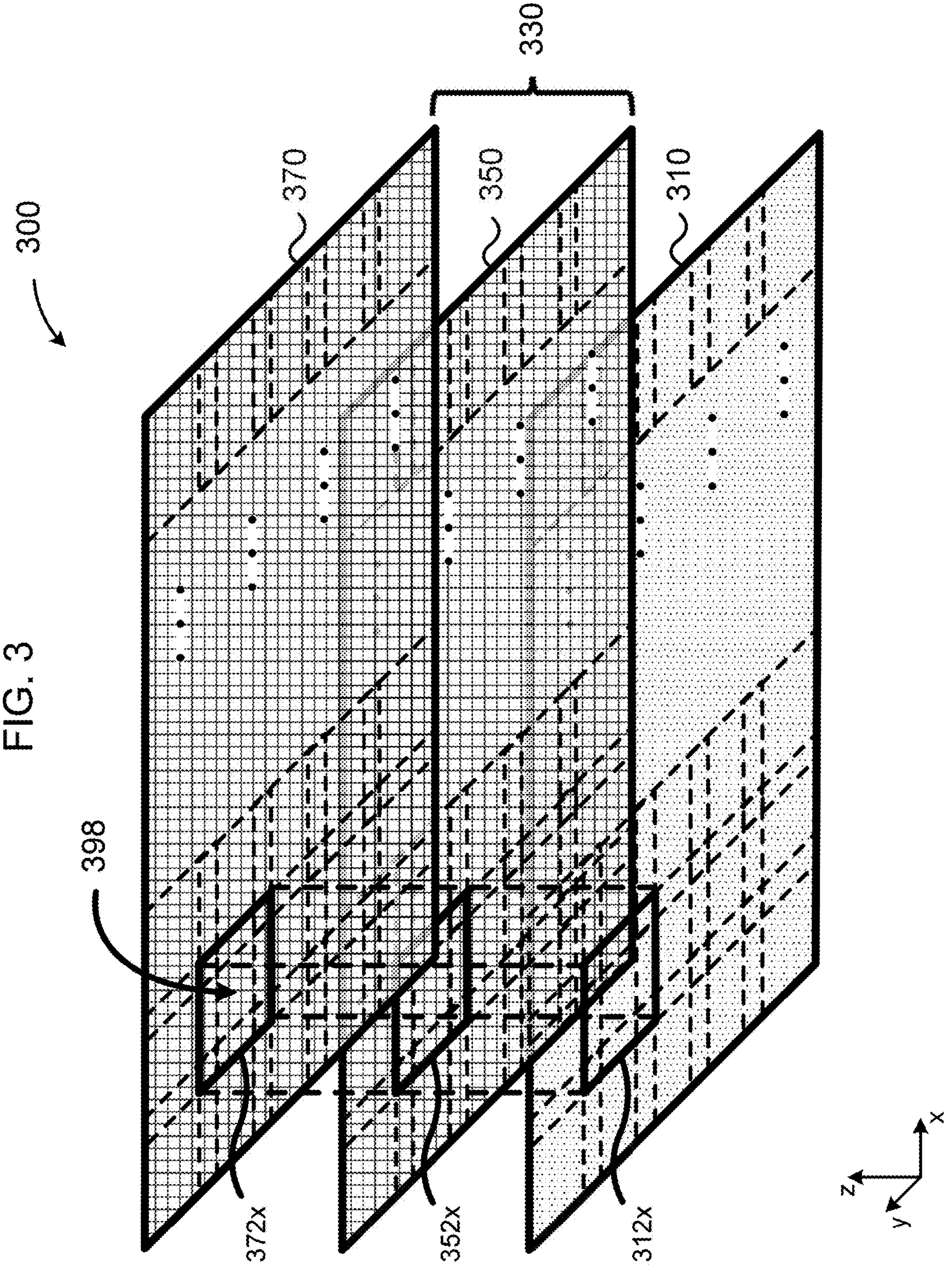
FIG. 3 illustrates a diagram of a spatial power source node location map and a spatial power distribution map of a 3D stacked device being vertically divided or sliced into overlapping windows, according to an example.

With reference to FIG. 3, a diagram 300 illustrates a spatial power source node location map 310 and a spatial power distribution map 330 of a 3D stacked device being vertically (e.g., in the z-dimension) divided or sliced into overlapping windows, according to an example. In the illustrated example, the 3D stacked device includes a lower semiconductor die layer and an upper semiconductor die layer. The spatial power distribution map 330 includes a lower layer current density map 350 for the circuitry on the lower semiconductor die layer, and an upper layer current density map 370 for the circuitry on the upper semiconductor die layer of the 3D stacked device. It should be understood that, in other examples, the 3D stacked device may include more than two semiconductor die layers, and the spatial power distribution map 330 may include more than two layers of 2D current density maps.

As illustrated in FIG. 3, the spatial power source node location map 310 and the spatial power distribution map 330 having current density maps 350 and 370 are divided or sliced along the z-dimension and into overlapping windows, where the windows overlap in the x-y plane.

In the illustrated example, each of the spatial power source node location map 310 and the current density maps 350 and 370 is logically divided into the same number of windows. Each window includes a frame (or a region) of the spatial power source node location map 310, and a frame (or a region) from each of the current density maps 350 and 370 in a column (e.g., in the z-dimension). For example, an exemplary window 398 is a 3-D window. From a top plan view (e.g., along the z-axis direction), the window 398 has a rectangular shape in the x-y plane. The window 398 includes a frame 312*x* (e.g., a 2-D image) of the spatial power source node location map 310, a frame 352*x* (e.g., a 2-D image) of the lower layer current density map 350, and a frame 372*x* (e.g., a 2-D image) of the upper layer current density map 370 in a column. The frames 312*x*, 352*x*, and 372*x* have the same size in the x-y plane and are vertically aligned in the z-dimension. In the illustrated example, all of the windows are of the same size in the x-y plane (e.g., N mm×M mm). It should be understood that, in other embodiments, the overlapping windows can be divided to have different sizes in the x-y plane.

As illustrated in FIG. 3, a window may overlap with one or more adjacent windows. In some embodiments, the amount of overlap between two adjacent windows may be 10% to 30%. In some embodiments, the amount of overlap between two adjacent windows may be less than 10% or greater than 30%.

Referring back to FIG. 2, at block 208, the computer system determines a voltage drop (e.g., a static voltage drop) distribution map for each window based on the divided spatial power distribution map and the divided spatial power source node location map. In the present embodiment, an ML based voltage drop prediction network of the computer system is used to receive the divided current density map for each of the semiconductor die layers and the divided spatial power source node location map in each of the windows. Based on these inputs, the ML based voltage drop prediction network determines a voltage drop distribution map for each of the windows. Put differently, for each window, based on the 2-D images (e.g., the frames 312*x*, 352*x*, and 372*x*), the voltage drop prediction network provides a 2-D image representing voltage drops across a region on a semiconductor die layer of interest, where the region corresponds to the area that the window projects on the semiconductor layer in the x-y plane.

Figure 4:
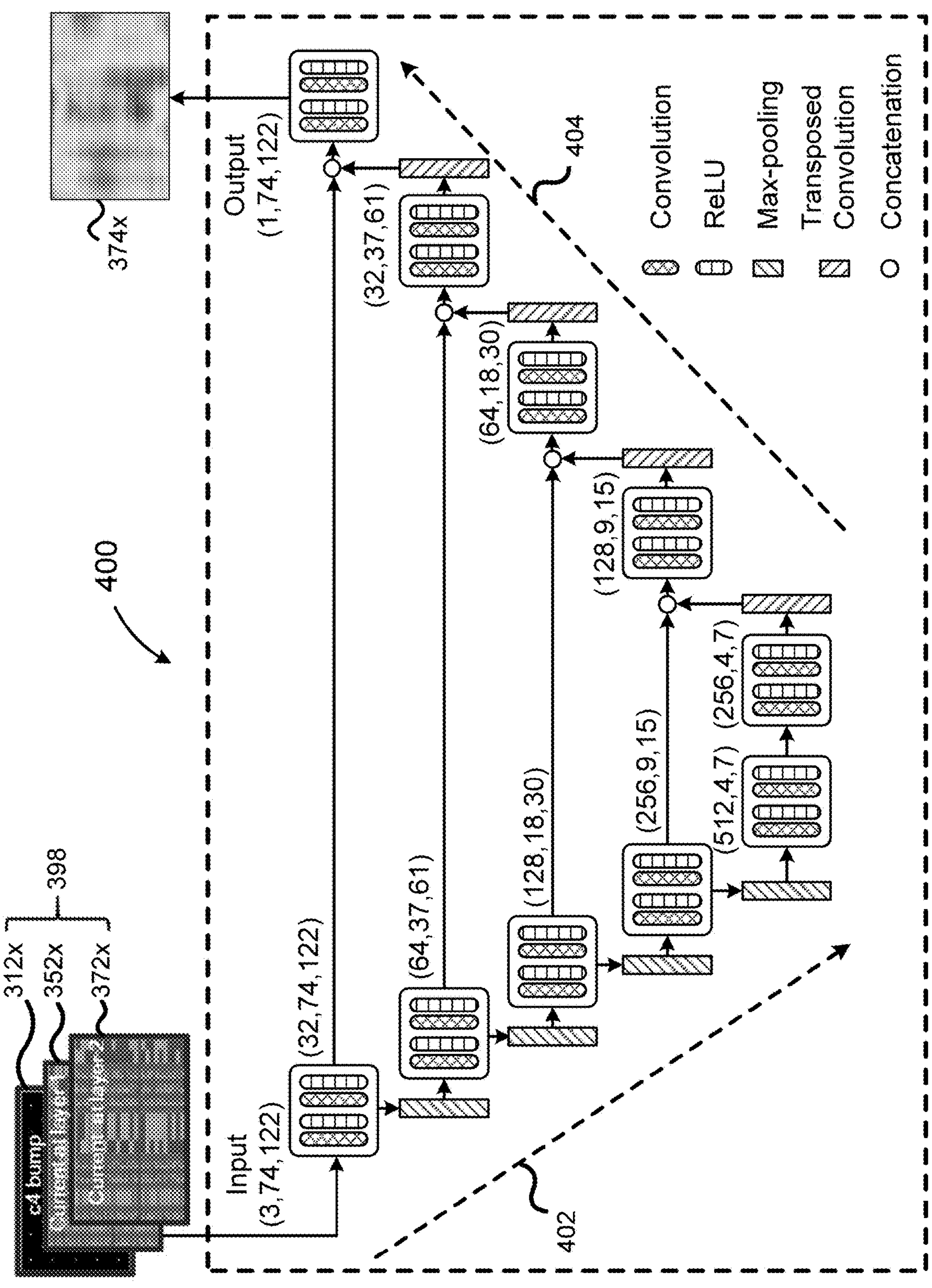
FIG. 4 illustrates an ML based voltage drop prediction network for predicting ML based voltage drops, according to an example.

FIG. 4 illustrates an ML based voltage drop prediction network 400 that can be used to perform the ML based voltage drop prediction described in block 208 in FIG. 2, according to an example. In the present embodiment, the ML based voltage drop prediction network 400 includes an ML based encoder-decoder network. As an example, the ML based voltage drop prediction network 400 may include an ML based U-Net architecture trained for making voltage drop predictions, for example, through image-to-image translation. It should be understood that other suitable network architectures can also be used to perform the ML based voltage drop prediction.

As illustrated in FIG. 4, the ML based voltage drop prediction network 400 may receive the frame 312*x* of the spatial power source node location map 310, the frame 352*x* of the lower layer current density map 350, and the frame 372*x* of the upper layer current density map 370 in the window 398 shown in FIG. 3. The ML based voltage drop prediction network 400 includes a downsampling (or encoding) path 402 and an upsampling (or decoding) path 404, where the ML-based voltage drop prediction network 400 performs encoding and decoding operations, respectively, to translate the divided spatial power distribution map and the divided spatial power source node location map to a voltage drop distribution map in the window 398. For example, the ML based voltage drop prediction network 400 may provide a voltage drop distribution map 374*x* for the upper semiconductor dies layer in the window 398 of the 3D stacked device.

As illustrated in FIG. 4, at the input, the three frames 312*x*, 352*x*, and 372*x* (e.g., images) each having 74×122 pixels (e.g., (3, 74, 122)) are provided to the ML based voltage drop prediction network 400. The three channel wide input images are mapped to 32 channel wide features by an initial double-convolution operation where each convolution is followed by a rectified linear unit (ReLU). Thereafter, each subsequent stage along the downsampling path 402 includes a maxpooling operation followed by a double-convolution operation (e.g., two convolutions each followed by a ReLU). At each downsampling stage, the number of feature maps is doubled, while the image size is reduced to, for example, half of the pixel length and half of the pixel width of the previous downsampling stage.

In one embodiment, an input to the ML based voltage drop prediction network 400 is I, which may be a real-valued image.

$$I \in \mathbb{R}^{C \times W \times H}, \quad \text{Equation (1)}$$

where C is the number of channels, and W and H are the width and height, respectively, of the 2D image in each channel. In the present case, C=3 for the upper semiconductor die layer, the lower semiconductor die layer, and the power source node layer.

In one embodiment, the convolution operation, denoted by $I^{\ell+1}=I^{\ell} * W^{\ell}$ is defined as $$\sum_{c\in[1,C],i'\in[1,K],j'\in[1,K]} W^{\ell}_{k,c,i',j'} I^{\ell}_{c,i+i'-1,j+j'-1}, \quad \text{Equation (2)}$$

where $I^{\ell} \in \mathbb{R}^{C^{\ell}\times W^{\ell}\times H^{\ell}}$ is the input; $W^{\ell} \in \mathbb{R}^{C^{\ell+1}\times C^{\ell}\times K\times K}$, with each filter of shape $C^{\ell}$ ×K×K and the parameter K is the kernel size; and $I^{\ell+1} \in \mathbb{R}^{C^{\ell+1}\times W^{\ell+1}\times H^{\ell+1}}$ is the output image.

In one embodiment, for the double convolution operation, each stage in the downsampling path 402 includes a max-pooling stage followed by a double convolution block that comprises of two stages of convolution.

$$O'^{\ell+1}_{k,i,j} = ReLU\left(I^{\ell} * W'^{\ell}\right), \quad \text{Equation (3)}$$

where $W'^{\ell} \in \mathbb{R}^{C^{\ell}/2\times C^{\ell}\times K\times K}$, so that the number of channels is reduced to half of the input channels; $O'^{\ell+1}_{k,i,j}$ is the intermediate output of the double convolution block; and ReLU is the activation function defined as, $$ReLU(x) = \max(0, x). \quad \text{Equation (4)}$$

The final output of the $1^{th}$ layer is $$O^{\ell+1}_{k,i,j} = ReLU\left(O'^{\ell+1}_{k,i,j} * W^{\ell}\right), \quad \text{Equation (5)}$$

where $W'^{\ell} \in \mathbb{R}^{C^{\ell+1}\times C^{\ell}/2\times K\times K}$.

In the upsampling path 404, each stage (except the final stage) includes a 2×2 transposed convolution block followed by a single 5×5 convolution stage that halves the number of feature channels, a concatenation with the correspondingly cropped feature map from the downsampling path 402. At the final stage, a double-convolution operation (e.g., two convolutions each followed by a ReLU) is performed, where the convolution kernel size is set to 1×1 and maps the 32 channel wide features to a heat map of one of the semiconductor die layers of the 3D stacked device. At each upsampling stage, the number of feature maps is halved, while the image size of each map is increased to, for example, doubled the pixel length and doubled the pixel width of the previous upsampling stage.

At the output, the ML based voltage drop prediction network 400 provides a voltage drop distribution map of one of the semiconductor layers of the 3D stacked device for each of the windows. The voltage drop distribution map output by the ML based voltage drop prediction network 400 is a 2-D image that represents voltage drops across a region of one of the semiconductor layers, where the region corresponds to the area that the window projects on the semiconductor layer in the x-y plane. In the present example, the output of the ML based voltage drop prediction network 400 is a predicted voltage drop distribution map 374*x*, which represents the voltage drop across the upper semiconductor die layer of the 3D stacked device in the window 398. In the present example, the size of the voltage drop distribution map 374*x* at the output is the same as the size of each of the three 2-D frames 312*x*, 352*x*, and 372*x* (e.g., 74×122 pixels) at the input. Put differently, in the present example, the ML based voltage drop prediction network 400 translates or converts three 2-D images in a 3-D window to a 2-D image representing voltage drops across a region in the upper semiconductor die layer in that window. It should be understood that each voltage drop distribution map provided by the ML based voltage drop prediction network 400 may overlap with one or more of its neighboring voltage drop distribution maps.

Although the voltage drop distribution map 374*x* provided by the ML based voltage drop prediction network 400 corresponds to the voltage drop distribution map of the upper semiconductor layer of the 3D stacked device in the illustrated example, the ML based voltage drop prediction network 400 may provide a predicted voltage drop distribution map that represents the voltage drops across any one of the semiconductor die layers of the 3D stacked device in any given window. In some embodiments, voltage drop prediction in multiple windows can be performed in parallel. In other embodiments, voltage drop prediction in multiple windows can be performed sequentially.

Referring back to FIG. 2, at block 210, the computer system combines the voltage drop distribution maps in each of the windows to form a composite voltage drop distribution map for an entire semiconductor die layer (e.g., the upper or topmost semiconductor die layer) of the 3D stacked device. In one example, the overlapping maps output by the ML based voltage drop prediction network are stitched together by weighted averaging to form the composite voltage drop map for the entire semiconductor die layer.

At block 212, the computer system determines whether a maximum voltage drop in the composite voltage drop distribution map is greater than a predetermined threshold. If the maximum voltage drop in the composite voltage drop distribution map is greater than the predetermined threshold, then the computer system, at block 214, re-places and/or re-routes the circuit elements on one or more of the plurality of semiconductor dies and/or the power source nodes before returning to block 202. If the maximum voltage drop in the composite voltage drop distribution map is within (e.g., less than or equal to) the predetermined threshold, then the computer system, at block 216, configures a 3D PDN based on the spatial power distribution map and the spatial power source node location map. The PDN analysis based on the method shown in the flowchart 200 can significantly reduce voltage drop prediction computation overheads (e.g., runtimes and resources).

Figure 5:
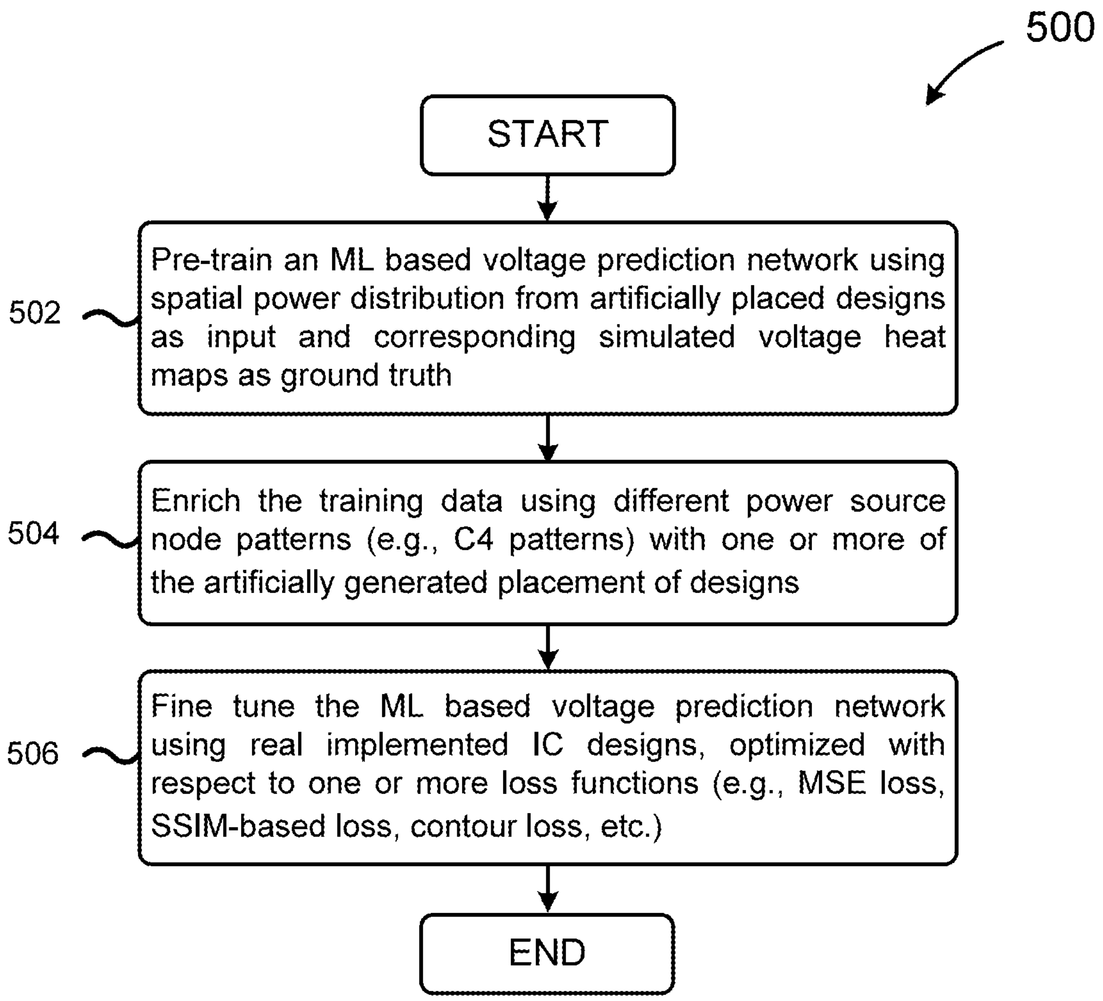
FIG. 5 illustrates a flowchart of a method performed by a computer system for training an ML based voltage prediction network, according to an example.

FIG. 5 illustrates a flowchart 500 of a method of training an ML based voltage prediction network, according to an example. In the present example, an ML based voltage drop prediction network, such as the ML based voltage drop prediction network 400 in FIG. 4, can be trained and optimized for predicting voltage drops on 3D PDNs.

At block 502, the ML based voltage prediction network is pre-trained to generate training data, for example, by using spatial power distribution from artificially placed designs as input and the corresponding simulated voltage heat maps as ground truth. For example, an artificially generated placement may include a heterogeneous IC design having non-uniform current density.

During the pre-training, weights are randomly initialized and then refined before they get to predetermined levels of optimization. Through the pre-training, the ML based voltage prediction network may learn that certain resources of an IC (e.g., look-up tables (LUTs), block random-access memories (BRAMs), buffers, ultra-random-access memories (URAMs), digital signal processing (DSP) blocks, phase-locked loops, etc.) may be used in certain frequencies and modes, and may consume certain amounts of power.

During the pre-training, the ML based voltage prediction network may also perform simulation (e.g., on a PDN simulation network) to obtain the ground truth that provides information regarding the amounts of voltage drop expected in a particular region of the design. For example, a SPICE simulation may be used to obtain the current density of a particular region, which can be used for the ground truth.

At block 504, different power source node patterns (e.g., C4 bump patterns) are also used to enrich the training data for the ML based voltage prediction network. For example, with each IC design, varying the locations of the C4 bumps may result in different voltage drop patterns due to the change in distance between the C4 bumps and the current sinks. Thus, training the ML-based voltage prediction network with different power source node patterns further expands the ML data. Voltage drop data gathered during blocks 502 and 504 allows the ML based voltage prediction network to reduce simulation runtimes and improve simulation accuracy for voltage drop predictions of real IC designs.

At block 506, the ML based voltage prediction network is fine-tuned using real implemented IC designs, optimized with respect to one or more loss functions. During the fine-tuning stage, a predicted voltage drop distribution map of a real implemented IC design is compared to a simulated voltage drop distribution map of the IC design to optimize, among other things, weights of the convolution filters and various loss functions.

In some embodiments, one or more loss functions of the ML based voltage prediction network are optimized. The loss functions may include, but are not limited to, a mean squared error (MSE) loss function, a structural similarity (SSIM) index-based loss function, and a contour-based loss function.

In some embodiments, the following weighted combination of loss functions is used to optimize the ML based voltage prediction network.

$$\mathcal{L} = \lambda_1 \mathcal{L}_{MSE} + \lambda_2 \mathcal{L}_{SSIM} + \lambda_3 \mathcal{L}_{Cont}, \quad \text{Equation (6)}$$

where:

$\mathcal{L}$ is the total loss;

$\mathcal{L}_{MSE}$ is the MSE loss;

$\mathcal{L}_{SSIM}$ is the SSIM index-based loss;

$\mathcal{L}_{Cont}$ is the contour-based loss;

$\lambda_1$, $\lambda_2$, $\lambda_3$ are weights that may be fine-tuned.

In the present example, the MSE loss is the squared difference between the predicted output and the target voltage heat map. For example, the MSE loss can be determined by:

$$\mathcal{L}_{MSE} = \|\hat{Y} - Y\|_2^2, \quad \text{Equation (7)}$$

where:

$\hat{Y}$ is the predicted output; and

Y is the target voltage heat map.

In the present example, the SSIM-based loss blurs both the predicted output and the target voltage heat map, and then compares the structural differences between the two. For example, the SSIM index-based loss can be determined by:

$$\mathcal{L}_{SSIM} = 1 - SSIM(\hat{Y}, Y), \quad \text{Equation (8)}$$

where SSIM($\hat{Y}$, Y) is the structural similarity index, between the reconstructed heat map and the simulation target.

Figure 6B:
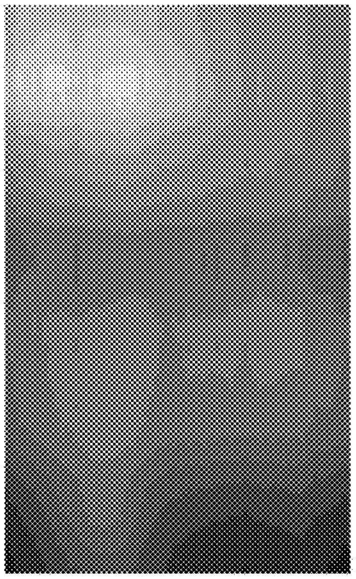
FIG. 6B illustrates a simulated target voltage drop heat map, according to an example.
Figure 6A:
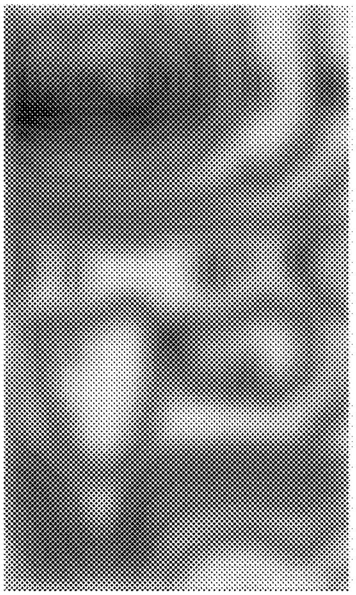
FIG. 6A illustrates a predicted k-step distance transform image (DTI) map, according to an example.

In the present example, the contour-based loss is the L1 difference between the predicted k-step DTI map (e.g., as illustrated in FIG. 6A) and the ground-truth target voltage drop heat map (e.g., as illustrated in FIG. 6B). For example, the contour-based loss can be determined by:

$$\mathcal{L}_{Cont} = \|DTI(G(\hat{Y})) - DTI(G(Y))\|_1, \quad \text{Equation (9)}$$

where:

G(·) is the Sobel operator; and

DTI(·) is the distance transform image operator, defined by Algorithm 1:

| Algorithm 1 DTI(Y) |
|---|
| Input: Edge detected image, Y<br>Output: Distance transformed image of Y.<br>Local: Let $N_s$ be the number of steps.<br>Let H be 7 × 7 averaging filter.<br>Let m be a constant factor.<br>For n = 1 To $N_s$<br>$Y \leftarrow Y + m \times (N_s - n)^2 \times H(Y)$<br>EndFor<br>Return Y. |

As such, an ML based voltage prediction network trained according to the method shown in flowchart 500 enables fast and accurate voltage drop predictions on the 3D PDN, and substantially eliminates unnecessary pessimism in timing calculation, which in turn improves the overall device performance.

Figure 7A:
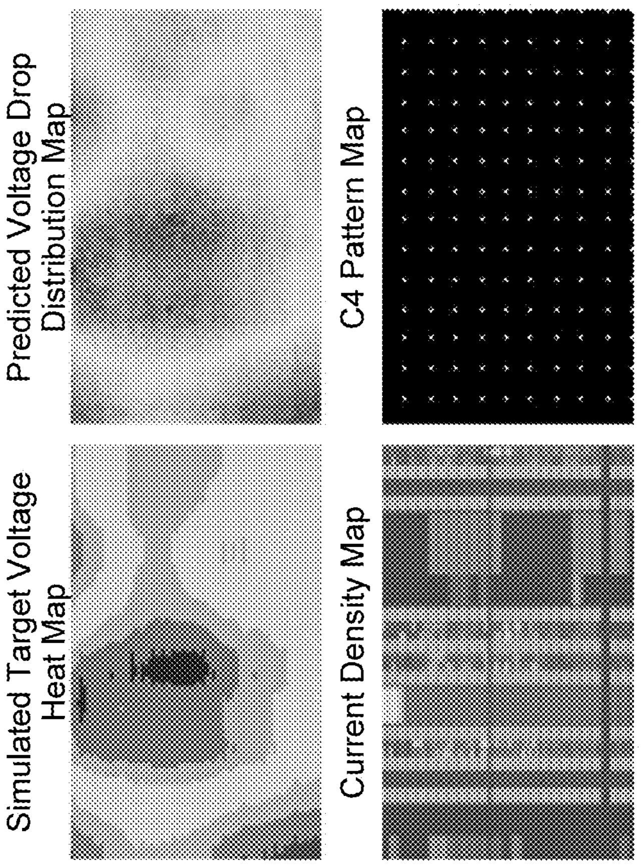
FIGS. 7A and 7B illustrate training results along with reference simulation data and other inputs of an ML based voltage prediction network, according to an example.
Figure 7B:
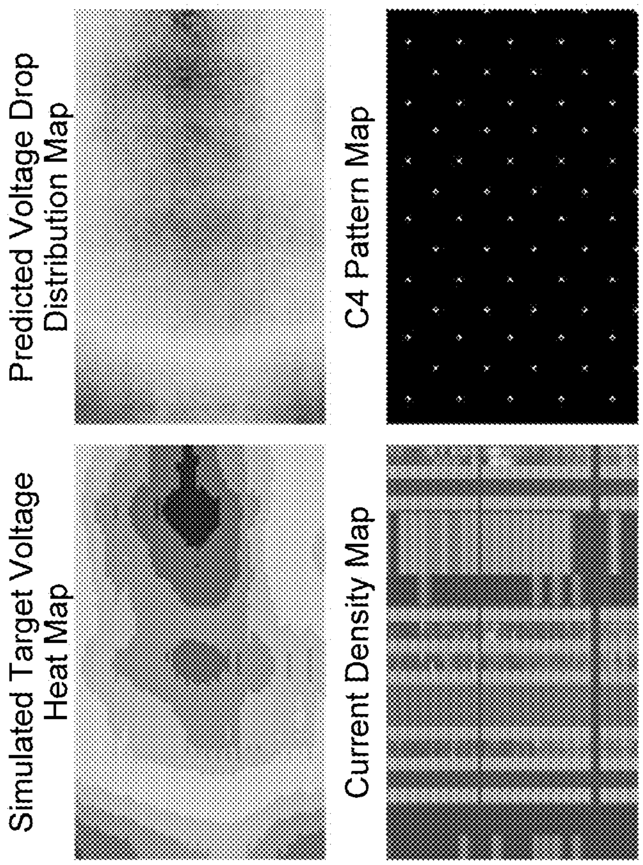

FIGS. 7A and 7B illustrate training results of an ML based voltage prediction network, according to an example. In each of FIGS. 7A and 7B, the ML based voltage prediction network receives a C4 pattern map and a current density map in a window, and provides a predicted voltage drop distribution map for the window. The predicted voltage drop distribution maps are validated by an example design, and each have an accuracy of about 98% when compared to their corresponding simulated target voltage heat maps in FIGS. 7A and 7B.

Figure 8A:
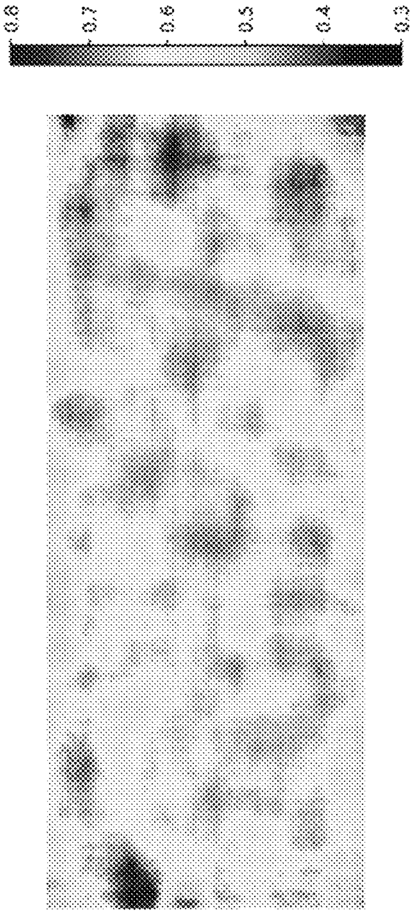
FIG. 8A illustrates a predicted composite voltage drop distribution map for an entire semiconductor die layer, according to an example.
Figure 8B:
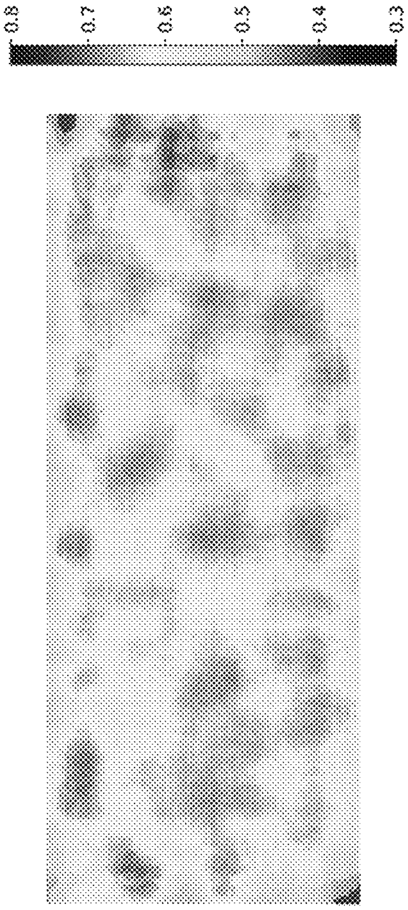
FIG. 8B illustrates a simulated composite target voltage heat map for an entire semiconductor die layer, according to an example.

FIGS. 8A and 8B illustrate a predicted composite voltage drop distribution map and a corresponding simulated composite target voltage heat map, respectively, for an entire semiconductor die layer, according to an example. The predicted composite voltage drop distribution map is created by stitching the voltage drop distribution maps in the overlapping windows together by weighted averaging.

The predicted composite voltage drop distribution map in FIG. 8A is provided by the computer system according to the present disclosure with 0.51 GMAC (Giga Multiply-Accumulate operation) per frame, where each frame takes about 3.3 milliseconds (ms) runtime (verified on the latest available GPU on the market). The ML based voltage drop prediction network can provide the entire composite map in 1.7 seconds when the voltage drop prediction in each window is performed sequentially. When the voltage drop prediction in each window is performed in parallel, the ML based voltage drop prediction network can provide the entire composite map in 0.2 seconds. When compared with the simulated composite target voltage heat map in FIG. 8B, the predicted composite voltage drop distribution map in FIG. 8A has a maximum voltage drop error of about 4.8 millivolts (mV), a training error of about 2.06%, a validation error of about 2.19%, and a test error of about 3.41%. It should be noted that, while the results above are specific to the example design illustrated, the network (e.g., the ML based voltage drop prediction network 400) can predict voltage drops ranging up to a few hundred millivolts.

Figure 9:
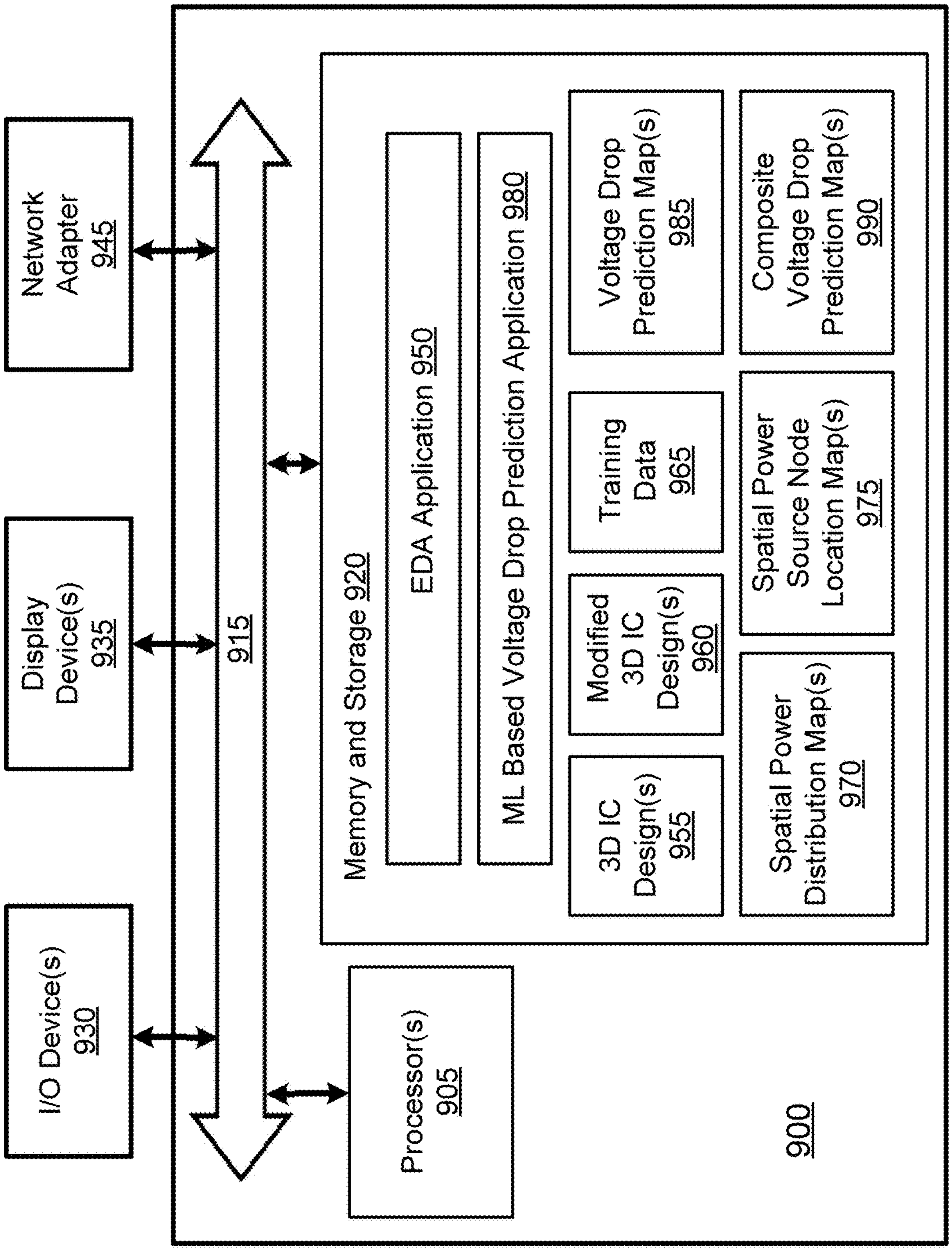
FIG. 9 illustrates a block diagram of a computer system, according to an example.

FIG. 9 illustrates a block diagram of a computer system (system) 900, according to an example. In the present embodiment, the system 900 includes an EDA system and an ML based voltage drop prediction system for performing the method described in FIG. 2.

As illustrated in FIG. 9, the system 900 includes at least one processor circuit (or "processor"), (e.g., a central processing unit (CPU)) 905, coupled to memory and storage arrangement 920 through a system bus 915 or other suitable circuitry. The system 900 stores program codes and data within the memory and storage arrangement 920. The processor(s) 905 may execute the program codes accessed from the memory and storage arrangement 920 via a system bus 915. In one aspect, the system 900 is implemented as a computer or other data processing system that is suitable for storing and/or executing program code. It should be appreciated, however, that the system 900 can be implemented in the form of any system including a processor and memory that is capable of performing the functions described within the present disclosure.

The memory and storage arrangement 920 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. The system 900 may also include one or more cache memories (not shown) that provide temporary storage of at least some program code and data in order to reduce the number of times program code and data must be retrieved from local memory and persistent storage during execution.

One or more input/output (I/O) devices 930 (e.g., user input device(s)) and display device(s) 935 may be coupled to the system 900. The I/O devices may be coupled to the system 900 either directly or through intervening I/O controllers. A network adapter 945 also can be coupled to the system 900 in order to couple the system 900 to other systems, computer systems, remote printers, and/or remote storage devices through intervening private or public networks. Modems, cable modems, Ethernet cards, and wireless transceivers are examples of different types of network adapter 945 that can be used with the system 900.

The memory and storage arrangement 920 may store an EDA application 950. The EDA application 950, which can be implemented in the form of executable program code (or instructions) and executed by the processor(s) 905. As such, the EDA application 950 is considered part of the system 900. The system 900, while executing the EDA application 950, receives and operates on a 3D IC design 955. In one aspect, the system 900 performs a design flow on the 3D IC design 955, and the design flow may include one or more of synthesis, mapping, placement, routing, and the application of circuit elements of the 3D IC. The system 900 generates and stores one or more modified (or optimized) versions of the 3D IC design(s) 955 as the modified 3D IC design(s) 960.

The memory and storage arrangement 920 may also store an ML based voltage drop prediction application 980, which can be implemented in the form of executable program code (or instructions) and executed by the processor(s) 905. As such, the ML based voltage drop prediction application 980 is considered part of the system 900. The system 900, while executing the ML based voltage drop prediction application 980, receives and operates on spatial power distribution map(s) 970 and spatial power source node location map(s) 975 based on the 3D IC design(s) 955, and generates voltage drop distribution map(s) 985 and composite voltage drop distribution map(s) 990. Data 965 used for training the ML based voltage drop prediction application 980 can also be stored in the memory and storage arrangement 920.

Although not explicitly shown, the memory and storage arrangement 920 may also store a circuit design tool (e.g., SPICE software to simulate circuit designs and provide target voltage heat maps), which can be implemented in the form of executable program code (or instructions) and executed by the processor(s) 905.

The EDA application 950, 3D IC design(s) 955, modified 3D IC design(s) 960, and any data items used, generated, and/or operated upon by the EDA application 950, as well as the ML based voltage drop prediction application 980, training data 965, spatial power distribution map(s) 970, spatial power source node location map(s) 975, voltage drop distribution map(s) 985 and composite voltage drop distribution map(s) 990, and any data items used, generated, and/or operated upon by the ML based voltage drop prediction application 980, are functional data structures that impart functionality when employed as part of the system 900 or when such elements, including derivations and/or modifications thereof, are loaded into an IC such as a programmable IC causing implementation and/or configuration of a circuit design (e.g., a 3D IC design) within the programmable IC.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method for predicting voltage drop on a power delivery network (PDN) of a 3D stacked device comprising a plurality of semiconductor dies stacked vertically on each other, the method comprising:

receiving a spatial power distribution map of the plurality of semiconductor dies;

receiving a spatial power source node location map for a plurality of power source nodes coupled to the 3D stacked device;

dividing, vertically, the spatial power distribution map and the spatial power source node location map into overlapping windows;

determining a voltage drop map in each of the windows for at least one of the plurality of semiconductor dies based on the divided spatial power distribution map and the divided spatial power source node location map;

combining the voltage drop map in each of the windows to form a composite voltage drop map for the at least one of the plurality of semiconductor dies.

2. The method of claim 1, further comprising:

re-placing or re-routing one or more of the plurality of semiconductor dies and the plurality of power source nodes, when a maximum voltage drop in the composite voltage drop map is greater than a predetermined threshold.

3. The method of claim 1, wherein the voltage drop map in each of the windows is determined by a machine learning (ML) based voltage drop prediction network.

4. The method of claim 3, wherein the ML based voltage drop prediction network includes an encoder-decoder network.

5. The method of claim 3, wherein the ML based voltage drop prediction network is trained by using at least one of:

artificially placed spatial power distribution designs;

power source node patterns corresponding to one or more of the artificially placed spatial power distribution designs; and real implemented integrated circuit (IC) designs optimized with respect to one or more loss functions.

6. The method of claim 1, wherein one or more of the plurality of semiconductor dies comprise a heterogeneous layout including one or more of input/output (I/O) circuitry, transceiver circuitry, hardware intellectual property (IP) circuitry, network-on-chip (NOC) circuitry, and processor circuitry.

7. The method of claim 1, wherein the spatial power distribution map comprises a plurality of current load distribution maps each corresponding to one of the plurality of semiconductor dies.

8. The method of claim 1, wherein the composite voltage drop map indicates static voltage drops on the at least one of the plurality of semiconductor dies.

9. The method of claim 1, wherein two or more of the voltage drop maps are determined in parallel.

10. The method of claim 1, wherein the plurality of power source nodes comprises controlled-collapse-chip-connection (C4) bumps.

11. A computer system, comprising:

a processor; and a non-transitory machine readable medium storing executable instructions that when executed by the processor cause the processor to perform operations including:

receiving a spatial power distribution map of a 3D stacked device comprising a plurality of semiconductor dies stacked vertically on each other;

receiving a spatial power source node location map for a plurality of power source nodes coupled to the 3D stacked device;

dividing, vertically, the spatial power distribution map and the spatial power source node location map into overlapping windows;

determining a voltage drop map in each of the windows for at least one of the plurality of semiconductor dies based on the divided spatial power distribution map and the divided spatial power source node location map;

combining the voltage drop map in each of the windows to form a composite voltage drop map for the at least one of the plurality of semiconductor dies.

12. The computer system of claim 11, wherein the non-transitory machine readable medium is further configured with instructions that when executed by the processor cause the processor to perform operations including:

re-placing or re-routing one or more of the plurality of semiconductor dies and the plurality of power source nodes, when a maximum voltage drop in the composite voltage drop map is greater than a predetermined threshold.

13. The computer system of claim 11, wherein the voltage drop map in each of the windows is determined by a machine learning (ML) based voltage drop prediction network.

14. The computer system of claim 13, wherein the ML based voltage drop prediction network includes an encoder-decoder network.

15. The computer system of claim 13, wherein the ML based voltage drop prediction network is trained by using at least one of:

artificially placed spatial power distribution designs;

power source node patterns corresponding to one or more of the artificially placed spatial power distribution designs; and real implemented integrated circuit (IC) designs optimized with respect to one or more loss functions.

16. The computer system of claim 11, wherein one or more of the plurality of semiconductor dies comprise a heterogeneous layout including one or more of input/output (I/O) circuitry, transceiver circuitry, hardware intellectual property (IP) circuitry, network-on-chip (NOC) circuitry, and processor circuitry.

17. The computer system of claim 11, wherein the spatial power distribution map comprises a plurality of current load distribution maps each corresponding to one of the plurality of semiconductor dies.

18. The computer system of claim 11, wherein the composite voltage drop map indicates static voltage drops on the at least one of the plurality of semiconductor dies.

19. The computer system of claim 11, wherein two or more of the voltage drop maps are determined in parallel.

20. A non-transitory computer-readable storage medium storing instructions, which when executed on one or more processing devices, perform an operation for predicting voltage drop on a power delivery network (PDN) of a 3D stacked device comprising a plurality of semiconductor dies stacked vertically on each other, the operation comprising:

receiving a spatial power distribution map of the plurality of semiconductor dies;

receiving a spatial power source node location map for a plurality of power source nodes coupled to the 3D stacked device;

dividing, vertically, the spatial power distribution map and the spatial power source node location map into overlapping windows;

determining a voltage drop map in each of the windows for at least one of the plurality of semiconductor dies based on the divided spatial power distribution map and the divided spatial power source node location map;

combining the voltage drop map in each of the windows to form a composite voltage drop map for the at least one of the plurality of semiconductor dies.

* * * * *